United States Patent
Matoba et al.

(10) Patent No.: US 8,703,511 B2
(45) Date of Patent: Apr. 22, 2014

(54) METHOD OF MANUFACTURING LIGHT EMITTING DEVICE

(71) Applicant: Nichia Corporation, Anan (JP)

(72) Inventors: Kosuke Matoba, Tokushima (JP); Takeaki Shirase, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 13/975,658

(22) Filed: Aug. 26, 2013

(65) Prior Publication Data

US 2013/0344631 A1     Dec. 26, 2013

Related U.S. Application Data

(62) Division of application No. 13/377,022, filed as application No. PCT/JP2010/062406 on Jul. 23, 2010, now Pat. No. 8,546,841.

(30) Foreign Application Priority Data

Jul. 30, 2009     (JP) .................................. 2009-177931

(51) Int. Cl.
 *H01L 21/00*     (2006.01)
(52) U.S. Cl.
 USPC .............................................. 438/26; 257/99
(58) Field of Classification Search
 USPC .......................... 438/26; 257/98, 99, E33.066
 See application file for complete search history.

(56) References Cited

U.S. PATENT DOCUMENTS

| | | | |
|---|---|---|---|
| 4,939,316 A * | 7/1990 | Mahulikar et al. ............ 174/546 |
| 2004/0104643 A1 | 6/2004 | Kawauchi et al. | |
| 2004/0120155 A1 | 6/2004 | Suenaga | |
| 2004/0201987 A1 | 10/2004 | Omata | |
| 2004/0238923 A1 * | 12/2004 | Lee et al. ....................... 257/670 |
| 2005/0013562 A1 | 1/2005 | Tatehata et al. | |
| 2007/0063201 A1 | 3/2007 | Kuo | |
| 2007/0126316 A1 | 6/2007 | Usuda et al. | |
| 2008/0315235 A1 | 12/2008 | Murazaki | |
| 2009/0057850 A1 * | 3/2009 | Moy et al. ..................... 257/666 |
| 2012/0171378 A1 * | 7/2012 | Xiao et al. ............... 427/255.35 |

FOREIGN PATENT DOCUMENTS

| | | |
|---|---|---|
| CN | 2741196 Y | 11/2005 |
| JP | 61-248536 A | 11/1986 |
| JP | 05-036854 A | 2/1993 |
| JP | 06-132413 A | 5/1994 |

(Continued)

OTHER PUBLICATIONS

Extended European Search Report of the corresponding European application No. 10804327.4, dated Feb. 18, 2014.

*Primary Examiner* — Phuc Dang
(74) *Attorney, Agent, or Firm* — Global IP Counselors, LLP

(57) ABSTRACT

A light emitting device is manufactured in which a cap having a frame portion is bonded to a package having a light emitting element mounted in a recess of the package to cover an opening of the recess. A method for manufacturing the light emitting device includes: partially disposing a metal bonding agent, having greater wettability to the frame portion than to the package, to one of the package and the frame portion; and bonding the package and the frame portion by extending the metal bonding agent along the frame portion so that ends of the metal bonding agent are joined to each other while defining a space at a joining portion where the ends of the metal bonding agent are joined.

11 Claims, 5 Drawing Sheets

(56) References Cited

FOREIGN PATENT DOCUMENTS

| | | |
|---|---|---|
| JP | 2000-106408 A | 4/2000 |
| JP | 2003-046133 A | 2/2003 |
| JP | 2004-327955 A | 11/2004 |
| JP | 2005-235857 A | 9/2005 |
| JP | 2005-235864 A | 9/2005 |
| JP | 2005-244121 A | 9/2005 |
| JP | 2006-261442 A | 9/2006 |
| JP | 2007-080859 A | 3/2007 |
| JP | 2007-149712 A | 6/2007 |
| JP | 2007-305703 A | 11/2007 |
| JP | 2009-095861 A | 5/2009 |
| WO | 02-089219 A1 | 11/2002 |

* cited by examiner

METHOD OF MANUFACTURING LIGHT EMITTING DEVICE

CROSS-REFERENCE TO RELATED APPLICATIONS

This application is a divisional application of U.S. patent application Ser. No. 13/377,022, filed on Dec. 8, 2011, now U.S. Pat. No. 8,546,841. This application claims priority to Japanese Application No. 2009-177931 filed in Japan on Jul. 30, 2009. The entire disclosures of U.S. patent application Ser. No. 13/377,022 and Japanese Application No. 2009-177931 are incorporated hereinto by reference.

FIELD OF THE INVENTION

The present invention relates to a light emitting device in which a package and a cap are bonded together, and to a method of manufacturing the light emitting device.

DESCRIPTION OF THE RELATED ART

In resent years, semiconductor light emitting elements of high luminance and high output power, and light emitting devices of small size and high sensitivity have been developed and used in various areas. Making use of the properties such as low electric consumption, small size, and light weight, such light emitting devices are utilized as light sources for optical printer heads, light sources for liquid crystal backlights, light sources for various indicators, and in various read sensors.

As an example of such a light emitting device, there has been proposed a light emitting device, in which a light emitting element 42 is mounted on the bottom surface of a recess defined in a surface of a package 41 as shown in FIG. 6(*a*) (for example, see JP 2003-46133A). A plate-shaped light color-converting member 43, which is made of a light transmissive resin containing a fluorescent material dispersed therein, is fixed with a bonding agent or the like on the surface of the package 41 so as to seal the opening of the recess. Generally, a light transmissive resin is used as the bonding agent.

As another example of a light emitting device provided with a light transmissive member which seals an opening of a recess of a package, there has been proposed a light emitting device as shown in FIG. 6(*b*) (for example, see JP 2007-305703A). A package 44 provided with a recess is used in the light emitting device shown in FIG. 6(*b*). Each semiconductor light emitting element 45 is die-bonded on the bottom surface of the recess and the electrodes of the semiconductor light emitting element 45 and the conductive members 46 provided to the package 44 are respectively electrically connected by using wires 47. A metal cap 49 having a light transmissive member 48 engaged thereto is bonded to the package 44 at the opening side of the recess to hermetically seal. Examples of the bonding method include a welding in which a metal cap 49 and a plating layer 50 formed on a surface of the ceramic package 44 are joined by welding to one another. A package in which a metal package and a metal portion of a lid are welded to one another and hermetically sealed has also been proposed (for example, see WO 2002/89219A).

DISCLOSURE OF INVENTION

However, as in the conventional light emitting devices, if a surface having the electrodes of the package provided thereon is located under the bonding portion of the cap covering the opening of the package, the bonding member used for the bonding may reach the electrodes along the wall surface of the package. At this time, if the bonding member is an insulating material such as a resin, it would not affect the operation of the light emitting device, but in a case where a conductive material is used for the bonding, the positive and negative electrodes of the package may be electrically connected through the bonding agent, and may result in an electrical short circuit.

In order to solve the problems described above, a method of manufacturing a light emitting device according to one aspect of the present invention includes a step of bonding a cap having a frame portion to a package having a light emitting element mounted in a recess so that the cap covers the opening of the recess. In the step of bonding, a metal bonding agent having a greater wettability to the frame portion than to the package is partially disposed to the package or the frame portion and then extended along the frame portion so that ends of the metal bonding agents are joined to each other. With this, a space is defined at a joining portion where the extended ends of the metal bonding agent are joined, and the package and the frame portion are bonded.

One or more arrangements described below can be combined with the light emitting device described above.

The frame portion is extended from the bonding portion with the package to inside the recess of the package. The package has an electrode in the recess and the light emitting element is connected to the electrode, and a step portion is provided between the electrode and the bonding portion to which the cap is bonded.

The frame portion has a rectangular shape in top view, and in the step of bonding, the metal bonding agent is disposed to two opposite sides of the frame portion and extended from the opposite sides of peripheral portion of the frame portion to the respective adjacent sides to bond.

The frame portion is made of a metal member.

The light emitting element is a light emitting element capable of emitting ultraviolet light.

The frame portion has a shape protruding along the step portion.

The frame portion has a surface at the recess side over the step portion.

A method of manufacturing a light emitting device according to another aspect of the present invention includes a step of bonding a cap to a package having a light emitting element mounted in a recess so that the cap covers the opening of the recess. The cap has a frame portion on its peripheral portion. The frame portion is bonded to the package and extended from the bonding portion with the package to inside the recess of the package. The package has an electrode in the recess in the recess and the light emitting element is connected to the electrode, and a step portion is formed between the electrode and the bonding portion to which the cap is bonded. In the step of bonding, a metal bonding agent having a greater wettability to the frame portion than that to the package is partially disposed to the package or to the frame portion. The metal bonding agent is extended along the frame portion to bond the package and the frame portion.

One or more steps described below can be combined with the method of manufacturing the light emitting device described above.

In the step of bonding, the metal bonding agent is extended and the ends thereof are joined to define a space at a joining portion where the ends of the metal bonding agent are joined.

The frame portion has a rectangular shape in top view, and in the step of bonding, the metal bonding agent is applied to opposite two sides of the frame portion and then extended from the opposite sides of peripheral portion of the frame portion to the respective adjacent sides to bond.

The frame portion is made of a metal member.

Also, in an aspect of the present invention, a light emitting device includes a package defining a recess, a light emitting element mounted in the recess, and a cap bonded to cover an opening of the recess. The cap has a frame portion at its peripheral portion, and the frame portion is bonded to the package and extended from the bonding portion with the package to inside the recess. The frame portion and the package are bonded by a metal bonding agent having a greater wettability to the frame than to the package. The package has an electrode in the recess to which the light emitting element is electrically connected, and has a step portion between the electrode and the bonding portion where the cap is bonded.

One or more arrangement described below can be combined with the light emitting device described above.

The frame portion has a shape protruding along the step portion.

The frame has a surface at the recess side over the step portion.

The frame portion is made of a metal member.

The light emitting element is a light emitting element capable of emitting ultraviolet light.

A method of manufacturing a light emitting device according to the above described aspects of the present invention enables stable manufacturing of non-air-tight light emitting device in which a conductive bonding agent is used to bond the package and the cap, with an improved yield.

Also, according to a light emitting device according to the above described aspects of the present invention, the frame portion of the cap is extended in the recess of the package and a metal bonding agent having a large wettability to the frame portion is used. With this, the metal bonding agent can be introduced into the recess of the package and can also be stopped by the step portion in the recess before reaching the electrodes of the package. Accordingly, occurrence of short circuit can be prevented. Also, the metal bonding agent is introduced in the recess of the package, so that the metal bonding agent can be prevented from leaking out of the package.

BRIEF DESCRIPTION OF DRAWINGS

FIG. 1b is a partially enlarged schematic view of FIG. 1a.

DESCRIPTION OF PREFERRED EMBODIMENTS

Light Emitting Device

Figure 1A:
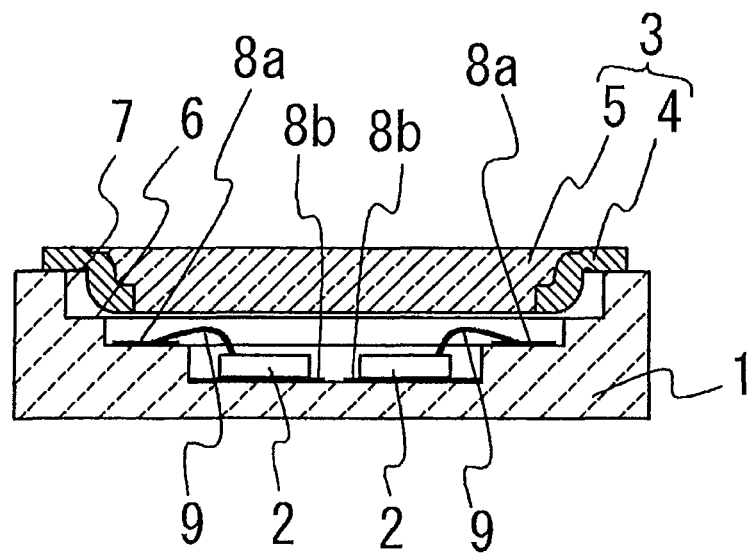
FIG. 1a is a schematic cross-sectional view showing a light emitting device of an embodiment of the present invention.

A light emitting device according to an embodiment of the present invention is shown in FIG. 1a. The light emitting device includes a package 1, light emitting elements 2 mounted in the recess of the package 1, and a cap 3 covering and sealing the opening of the recess defined in the package. A recess is defined in the package 1 so that the light emitting elements 2 can be mounted in the recess. The light emitting elements 2 are respectively fixed to the bottom surface of the recess by using a bonding member. The electrodes of each light emitting element and the electrodes 8a, 8b provided in the package 1 are respectively electrically connected by conductive wires 9.

Figure 1B:
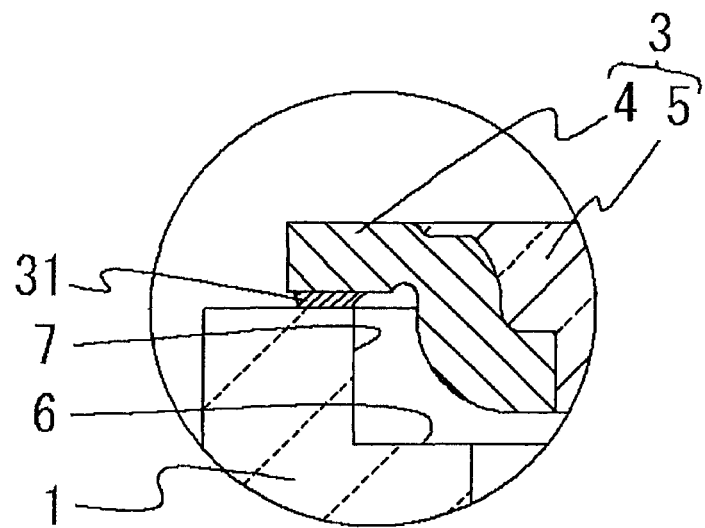

An upper portion of the recess is covered and sealed by the cap 3 having the frame portion 4 and the light transmissive member 5, and as shown in FIG. 1b, the frame portion 4 and the package 1 is bonded with a metal bonding agent 31. FIG. 1b is a partially enlarged schematic view of FIG. 1a. The metal bonding agent 31 has wettability with respect to the frame portion 4 larger than that with respect to the package 1, and as shown in FIG. 1b, the metal bonding agent 31 tends to spread along the frame portion 4. The frame portion 4 has a shape that extends from the bonding portion between the frame portion 4 and the package 1 into the recess defined in the package 1. In the recess of the package 1, a step portion 6 is formed between the bonding portion and the electrode 8a. With this arrangement, the metal bonding agent 31 introduced in the recess can be prevented from reaching the electrode 8a, so that occurrence of short circuit in the light emitting device can be prevented. The number of the step portions in this case may be one or may be two or more. Also, excessive bonding agent can be held at the step portion, so that an extra amount of bonding agent can be used. Thus a light emitting device, in which the package and the cap are firmly bonded, can be obtained with a good manufacturing yield.

The frame portion 4 of the cap 3 preferably has a shape protruding along the step portion 6 as shown in FIG. 1a. With such a shape, the metal bonding agent 31 can be guided to the step portion 6 efficiently. The channel from the bonding portion into the recess is narrowed by adjusting the distance between the frame portion 4 and the side wall 7 defining the recess, so that the metal bonding agent 31 can be introduced in the recess efficiently. The frame portion 4 and the side wall 7 defining the recess may be bonded with the metal bonding agent 31. With such a construction, the bonding area of the cap 3 and the package 1 can be increased and their bonding strength can be improved. In the present embodiment, the term "step portion 6" means, as shown in FIG. 1a, a portion protruding toward the center of the recess than the side wall 7 which defines the recess and is continuous from the bonding portion.

The upper surface of the step portion 6 is preferably arranged approximately parallel to the back surface of the package 1 or inclined toward the side wall 7 defining the recess so that flowing out of the metal bonding agent 31 can be prevented. In a case where the surface of the cap 3 at the recess side is approximately flat as in the light emitting device shown in FIG. 1a, the upper surface of the step portion 6 is preferably arranged in parallel to the approximately flat surface of the cap 3. In a case where the upper surface of the step portion 6 is set at a height that allows the upper surface to come in contact with the cap 3, and when irregularities occur in the thickness or the like of the cap 3 or the package 1, the cap 3 may not fit. Therefore, the upper surface of the step portion 6 and the cap 3 are preferably spaced apart in order to increase manufacturing yield. For similar reason, in a case where the cap 3 has a shape that protrudes into the recess, the outer diameter of the protrusion of the cap 3 is preferably small than the inner diameter of the side wall 7 defining the recess.

It is preferable that the frame portion 4 is bent along the step portion 6 and the surface of the frame portion 4 extending along the side wall 7, which defines the recess, is placed over the step portion 6. In a case where the frame portion 4 is provided along the protrusion of the cap 3, the surface of the frame portion 4 which faces the recess is preferably set at a position higher than the step portion 6. With those structures, the metal bonding agent 31 introduced in the recess through the frame portion 4 which has large wettability can be easily blocked at the step portion 6. The frame portion 4 may have a shape such that the frame portion 4 is not extended to the surface of the cap 3 along the upper surface of the step portion 6 and the end of the frame portion 4 is arranged at the above-described corners (bent parts of the frame portion 4) or the surfaces along the side walls 7 defining the recess. The frame portion 4 is preferably has a shape that is extended to the surface along the upper surface of the step portion 6 in order to hold the light transmissive member 5.

Figure 2:
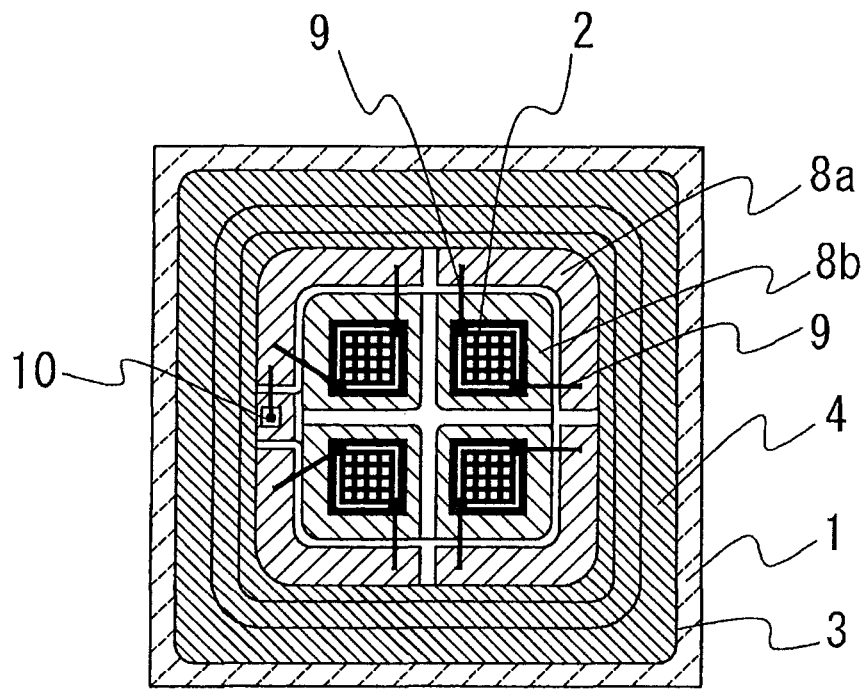
FIG. 2 is a schematic front view showing a light emitting device of the embodiment of the present invention.

FIG. 2 shows an example of a schematic front view of a light emitting device according to the present embodiment. In the light emitting device shown in FIG. 2, four light emitting elements 3 are mounted on the bottom surface of the recess of the package 1 and the electrodes 8b of the package 1 to each of which an element is connected are spaced apart from each other. In FIG. 2, the light transmissive member 5 is omitted for convenience of description. The light emitting elements 3 shown in FIG. 2 are of the opposite electrode structure in which the upper surface is n-electrode and the bottom surface is p-electrode. The p-electrode of each light emitting element 3 is electrically connected by a conductive bonding agent to respective electrode 8b which is provided on the bottom surface of the recess. The n-electrode of each light emitting element 3 is, as shown in FIG. 1a, electrically connected by a conductive wire 9 to respective electrode 8a which is provided on a surface one step higher than the bottom surface of the recess. The electrodes 8a, 8b of the package 1, though not shown, are connected to the back surface electrode through the package or through the outer wall of the package, and the back surface electrode is fixed by a solder or the like to electrically connect to a circuit board. In the present embodiment, four light emitting elements are connected in series. As shown in FIG. 2, a protective element 10 may be provided to the electrode 8a, 8b.

Method of Manufacturing Light Emitting Device

A method of manufacturing a light emitting device according to the present invention includes a step of bonding a package 1 and a frame portion 4 with a metal bonding agent 31. Examples of the metal bonding agent 31 which bonds the frame portion 4 and the package 1 include AuSn alloy, high melting point temperature solder, and Ag solder. In view of the temperature at time of bonding, AuSn alloy which can be melted at a low temperature is preferably used. The metal bonding agent 31 can be used in the form of, for example, a paste and a solid which is previously disposed on the frame portion 4. Examples of the light transmissive member 5 include a light transmissive glass.

A bonding method may be such that a metal bonding agent 31 is partially disposed and extended along the frame portion 4 for bonding. With such a method in which a metal bonding agent 31 is extended along the frame portion 4 for bonding, the metal bonding agent 31 tends to flow outside of the frame portion 4 or inside the recess. However, with a package 1 having a step portion 6 according to the present embodiment, the metal bonding agent 31 can be blocked before reaching the electrode 8a of the package 1.

Figure 3:
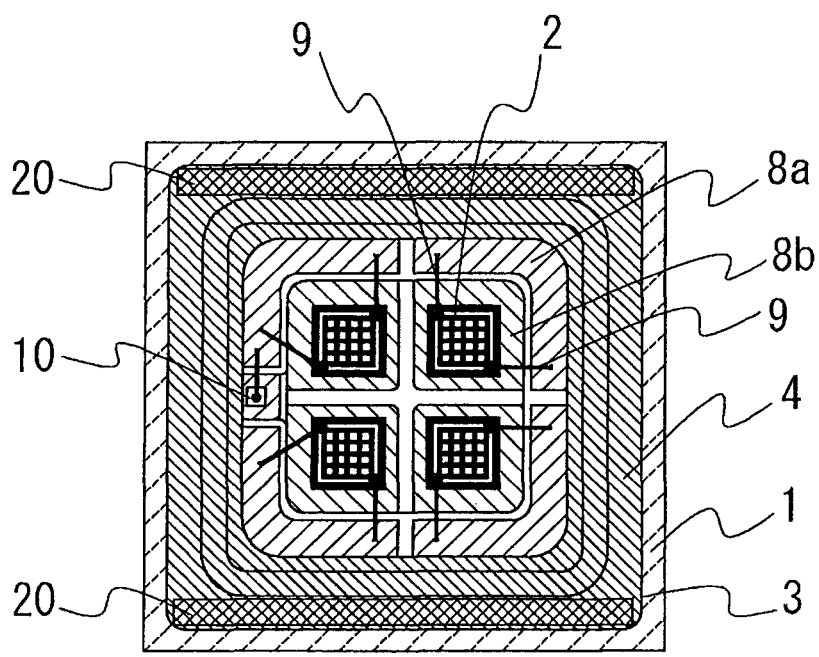
FIG. 3 is a schematic front view illustrating a method of manufacturing a light emitting device of the embodiment of the present invention.

An example of a method used to bond the frame 4 and the package 1 will be described with reference to FIG. 3. FIG. 3 is a schematic front view illustrating a method of manufacturing the light emitting device according to the present embodiment. As shown in FIG. 3, a metal member 20 for bonding is disposed as the metal bonding agent. Although the metal member 20 for bonding is disposed between the frame portion 4 and the package 1 and cannot be seen from the top view, the forming position of the metal member 20 for bonding is schematically shown in FIG. 3 for illustration. The metal member 20 for bonding is preferably disposed at the frame portion 4 which has high wettability. The metal member 20 for bonding which is disposed as described above is melted by applying heat so as to be extended along the frame portion 4 as the metal bonding agent, thus, the frame portion 4 and the package 1 can be bonded. A load may be applied to the frame portion 4 to facilitate extending the metal bonding agent. The load in this case may be applied from one end to the other end of the frame portion, but is preferably applied uniformly with respect to the frame portion. The metal member 20 for bonding is preferably disposed at opposite positions on the frame portion 4. In a case where the plan view of the frame portion 4 is rectangular as shown in FIG. 3, the metal member 20 is preferably disposed along the opposite two sides. Particularly, disposing the metal member 20 to reach the corners of adjacent sides allows it to extend to the adjacent sides easily. The frame portion 4 is preferably formed square in plan view to extend the metal bonding agent uniformly.

It is preferable that the metal bonding agent 31 is partially provided on the frame portion 4 after bonding. That is, a light emitting device is preferably arranged such that a space which can serve as a vent is provided between the metal bonding agent 31 and the metal bonding agent 31. The reason is that, if the metal bonding agent 31 is applied to the entire circumference of the frame portion 4 to obtain air-tightness through bonding, insufficient bonding may occur due to irregularity on the surface of the package 1 that results in lower manufacturing yield. Non-air-tight light emitting devices can be manufactured stably and the manufacturing yield thereof can be improved by partially applying the metal bonding agent 31. The thickness of the metal bonding agent 31 which is melted and bonded can be set from about several micrometers to about several tens of micrometers, so that a space sufficient to prevent foreign substances from entering can be provided. In a light emitting device in which a light emitting element capable of emitting ultraviolet light is used, the gas contained in the recess of the package may be altered or decomposed by the ultraviolet light. Providing such a space enables a gas or the like to be released outside of the light emitting device, so that a light emitting device with a high reliability can be obtained.

Figure 4A:
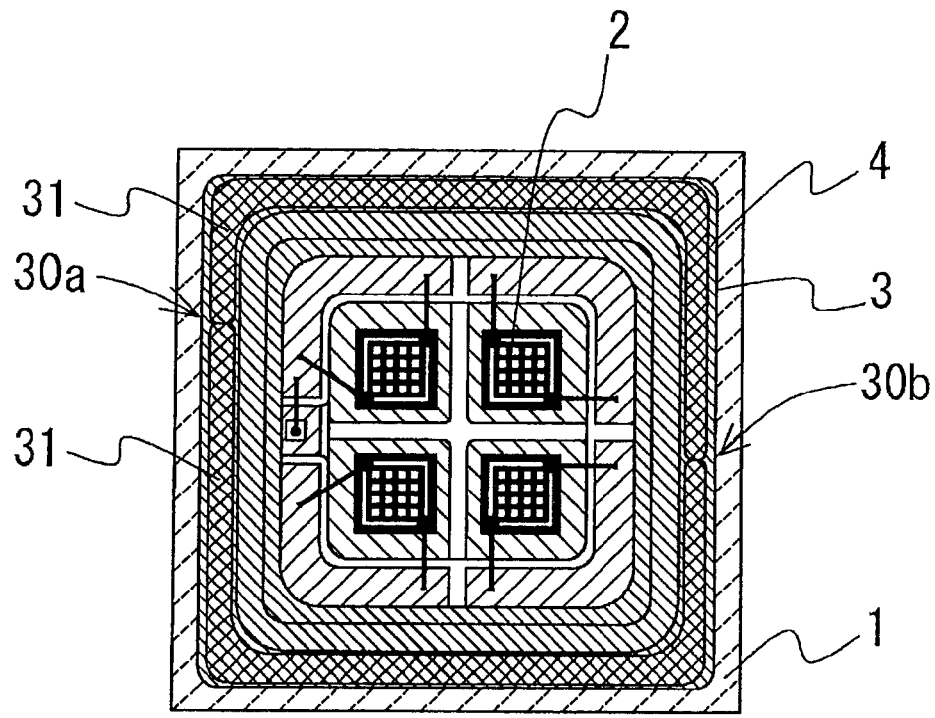
FIG. 4a is a schematic front view illustrating a method of manufacturing a light emitting device of the embodiment of the present invention.
Figure 4B:
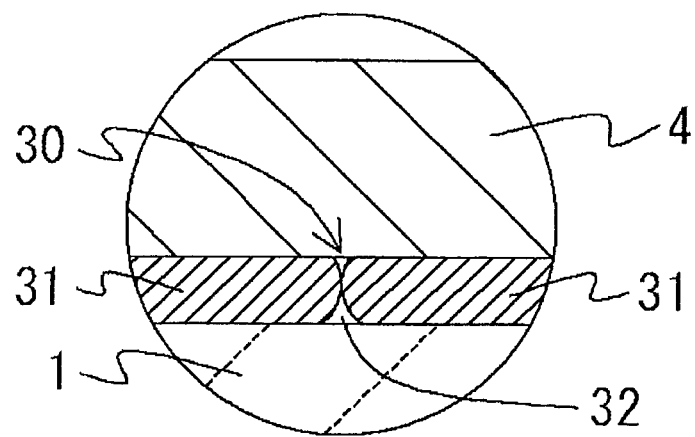
FIG. 4b is a schematic enlarged view of the joining portion 30b of FIG. 4a as seen from the right direction in the figure.

As shown in FIG. 4a, a space is preferably provided at the joining portions 30a and 30b where the ends of the metal bonding agent 31 are joined. For example, the metal member 20 shown in FIG. 3 is melted to bond the frame portion 4 and the package 1 and thus the metal bonding agent 31 shown in FIG. 4a is formed. FIG. 4a is a schematic front view illustrating a method of manufacturing the light emitting device according to the present embodiment. The metal bonding agent 31 is a member formed between the frame portion 4 and the package 1, so that cannot be seen from the top view, but in FIG. 4a, the forming position of the metal bonding agent 31 is schematically shown for illustration. As shown in FIG. 4a, the metal bonding agent 31 can be disposed approximately entire circumference of the frame portion 4 by forming a space at the joining portions 30a and 30b, which allows obtaining a light emitting device in which the package 1 and the cap 3 are firmly bonded and also the width of the spaces can be set from about several micrometers to about several tens of micrometers which allows further prevention of foreign substances from entering. The metal member is preferably made of a metal material so as to obtain a bonding agent which is less extendable than a bonding agent made of a mixture of a metal and a flux, thus facilitates provision of the spaces. Moreover at the time of melting and extending the metal member, a relative decrease in the temperature due to exposure of the surface of the metal member to atmosphere results in incomplete joining even when the parts of the metal member are in contact to each other, so that a space 32 is observed at the joining portions 30a and 30b after joining the metal member 20 to each other, as shown in FIG. 4b. FIG. 4b is a schematic enlarged view of the joining portion 30b of FIG. 4a as seen from the right direction in the figure.

Such a space can be formed by melting a metal member which is to become the metal bonding agent at a temperature which allows the metal bonding agent to extend along the frame portion 4 but does not allow the metal bonding agent 31 to join to each other, then, the metal bonding agent is extended along the frame portion 4 and bonded. For example, in a case where the metal bonding agent is made of an AuSn alloy, about 200 to 330° C. is preferable. Such a temperature range is lower than the growth temperature of the semiconductor layer constituting the light emitting element 2, so that adverse effect on the light emitting element 2 can be prevented.

It is preferable that the spaces defined at the joining portions 30a and 30b of the metal bonding agent 31 to each other are arranged such that the height of the space is less than the thickness of the metal bonding agent 31 in the thickness direction (distance between the package and the frame portion via the metal bonding agent 31). It is also preferable that the spaces are arranged such that, for example, at the frame portion side or at the package side (preferably the package side), the maximum width of the space is several micrometers to several tens of micrometers as described above. Each of the components of the present invention will be described below.

Package 1

A material having a smaller wettability with respect to the metal bonding agent 31 than to the frame portion 4 is selected for the package 1. For example, a ceramic can be used. Specific examples thereof include AlN and $Al_2O_3$. Ceramic has excellent resistance to ultraviolet light, so that it is preferably employed when an ultraviolet-emitting element is used for the light emitting element 2. The package 1 can be provided with a metal plating of Au and the like at a position where the metal bonding agent 31 is to be disposed, in order to facilitate the extension of the metal bonding agent 31. In this case, in order to prevent the metal bonding agent 31 from leaking out of the package, the metal plating is preferably applied to a position which can be totally covered with the cap 3. It is sufficient that a region which allows mounting the light emitting element 2 is secured in the recess of the package 1. In a case where a protective element 10 such as Zener diode is applied, a mounting region for the protective element 10 is provided in the recess.

Figure 5:
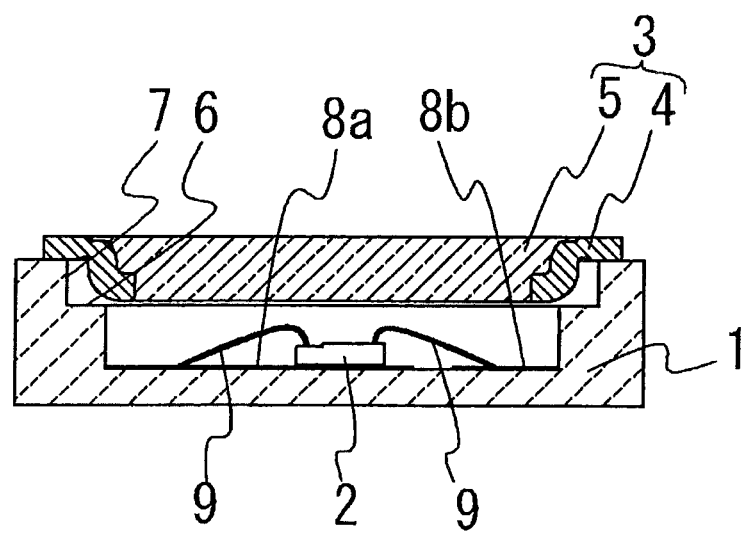
FIG. 5 is a schematic cross-sectional view showing a light emitting device of another embodiment of the present invention.
Figure 6A:
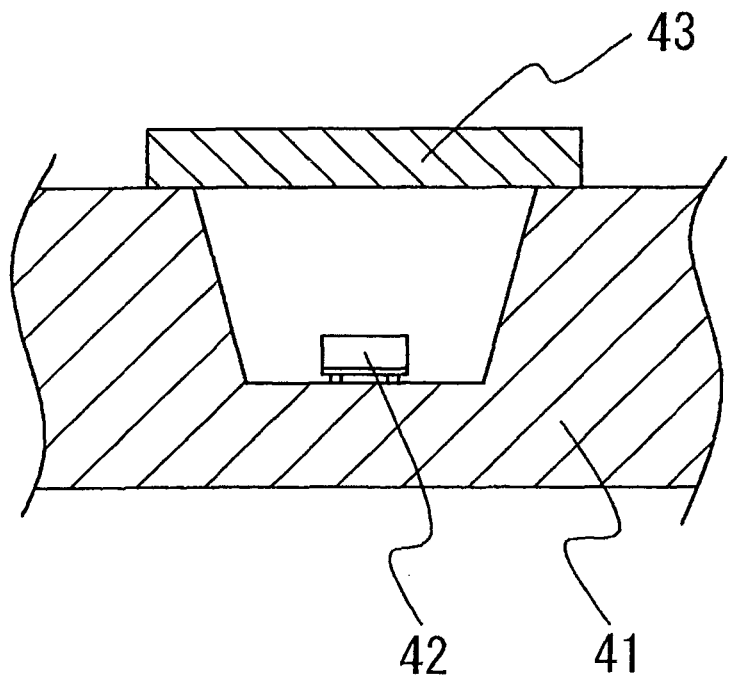
FIGS. 6a and 6b are schematic cross-sectional views each showing a conventional light emitting device.
Figure 6B:
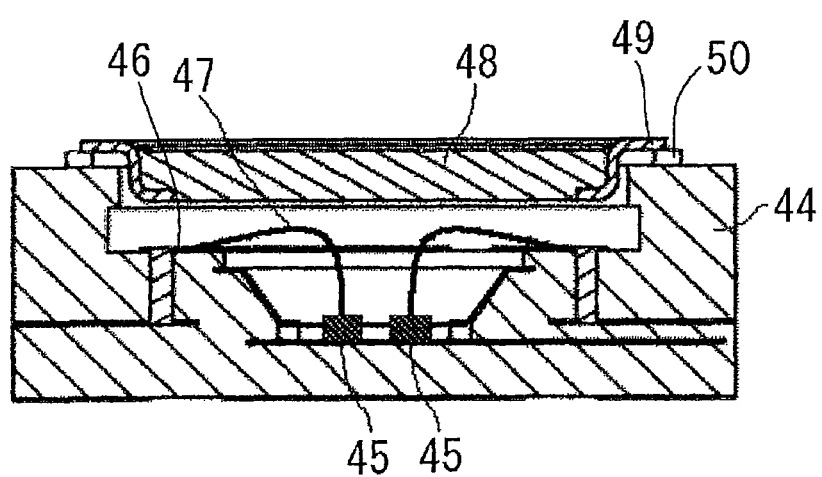

The package 1 is not limited to such as shown in FIG. 1a in which the electrode 8a to which the conductive wire 9 is connected is provided at a higher position than the mounting surface of the light emitting elements 2, and as shown in FIG. 5, the package 1 may have the electrodes 8a and 8b on the same plane as the mounting surface of the light emitting elements 2. FIG. 5 is a schematic cross sectional view illustrating another example of the light emitting device according to the present invention, in which the conductive wires 9 are respectively connected to the n-electrode and the p-electrode disposed on one of the main surfaces of the light emitting element 2, and the other ends of the conductive wires are respectively connected to the electrodes 8a and 8b of the package.

Light Emitting Element 2

The light emitting element 2 is a semiconductor light emitting element which can be used as a light emitting diode (LED) or a laser diode (LD). A light emitting element capable of emitting ultraviolet light may also be used. In a case where a light emitting element capable of emitting ultraviolet light is used, if a member containing an organic component such as a resin is used as the bonding agent, the organic component may be decomposed by ultraviolet light and adhere to the light emitting element. On contrast, a metal bonding agent is used in the present embodiment, so that the above-described problem can be prevented.

Cap 3

The cap 3 at least has a frame portion 4, and the cap 3 further has a light transmissive member 5 engaged in the frame portion 4. The shape of the frame portion 4 in a planar view may be selected from a rectangular configuration, a circular configuration, and oval configuration, and it is preferable that a square configuration as described above is selected. The material of the frame portion 4 is selected from materials to which the metal bonding agent has greater wettability than to the package 1, and it is preferable that at least the surface of the frame portion 4 is made of a metal. Specifically, a nickel-cobalt ferrous alloy such as KOVAR can be used and its surface may be plated with Au in order to improve the bonding strength with the metal bonding agent.

DENOTATION OF REFERENCE NUMERALS

1: package; 2: light emitting element; 3: cap; 4: frame portion; 5: light transmissive member; 6: step portion; 7: side wall defining the recess; 8a, 8b: electrode of the package; 9: conductive wire; 10: protective element; 20: metal member for bonding; 30a, 30b: joining portion; 31: metal bonding agent; 32: space; 41: package; 42: light emitting element; 43: color converting member; 44: package; 45: semiconductor light emitting element; 46: conductive member; 47: conductive wire; 48: light transmissive member; 49: metal cap; 50: plating.

What is claimed is:

1. A method of manufacturing a light emitting device in which a cap having a frame portion is bonded to a package having a light emitting element mounted in a recess of the package to cover an opening of the recess, the method comprising:
    partially disposing a metal bonding agent, having greater wettability to the frame portion than to the package, to one of the package and the frame portion; and
    bonding the package and the frame portion by extending the metal bonding agent along the frame portion so that ends of the metal bonding agent are joined to each other while defining a space at a joining portion where the ends of the metal bonding agent are joined.

2. The method of manufacturing a light emitting device according to claim 1, wherein the frame portion extends inside the recess of the package from a bonding portion where the cap and the package are bonded, the package has an electrode in the recess and the light emitting element is connected to the electrode, and the package has a step portion disposed between the electrode and the bonding portion.

3. The method of manufacturing a light emitting device according to claim 1, wherein the frame portion has a rectangular shape in top view, and the bonding of the package and the frame portion includes applying the metal bonding agent to opposite two sides of a peripheral portion of the frame portion and extending the metal bonding agent from the opposite two sides of the frame portion toward respective adjacent sides of the peripheral portion of the frame portion to bond the package and the frame portion.

4. The method of manufacturing a light emitting device according to claim 1, wherein the frame portion is made of a metal member.

5. The method of manufacturing a light emitting device according to claim 1, wherein the light emitting element is configured and arranged to emit ultraviolet light.

6. The method of manufacturing a light emitting device according to claim 2, wherein the frame portion has a shape protruding along the step portion.

7. The method of manufacturing a light emitting device according to claim 6, wherein the frame portion has a surface facing the recess over the step portion.

8. A method of manufacturing a light emitting device in which a cap having a frame portion is bonded to a package having a light emitting element mounted in a recess of the package to cover an opening of the recess, wherein the cap has a frame portion disposed in a peripheral portion of the cap with the frame portion being bonded to the package and extended from a bonding portion where the cap and the package are bonded to inside the recess of the package, the package has an electrode in the recess and the light emitting element is connected to the electrode, and the package further includes a step portion formed between the electrode and the bonding portion, the method comprising:

partially disposing a metal bonding agent, having greater wettability to the frame portion than to the package, on one of the package and the frame portion; and bonding the package and the frame portion by extending the metal bonding agent along the frame portion.

9. The method of manufacturing a light emitting device according to claim 8, wherein the bonding of the package and the frame portion includes extending the metal bonding agent so that ends of the metal bonding agent are joined each other while defining a space at a joining portion where the ends of the metal bonding agent are joined.

10. The method of manufacturing a light emitting device according to claim 8, wherein the frame portion has a rectangular shape in top view, and the bonding of the package and the frame portion includes applying the metal bonding agent to opposite two sides of a peripheral portion of the frame portion, and extending the metal bonding agent from the opposite two sides of the frame portion to respective adjacent sides of the peripheral portion of the frame portion to bond the package and the frame portion.

11. The method of manufacturing a light emitting device according to claim 8, wherein the frame portion is made of a metal member.

\* \* \* \* \*